United States Patent
Besser et al.

(10) Patent No.: US 6,171,919 B1
(45) Date of Patent: Jan. 9, 2001

(54) MOS TRANSISTOR FORMATION PROCESS INCLUDING POST-SPACER ETCH SURFACE TREATMENT FOR IMPROVED SILICIDE FORMATION

(75) Inventors: Paul R. Besser, Austin, TX (US); Minh Van Ngo, Union City, CA (US); Simon S. Chan, Saratoga, CA (US); Angela T. Hui, Fremont, CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/361,155

(22) Filed: Jul. 27, 1999

(51) Int. Cl.⁷ .................................................. H01L 21/336
(52) U.S. Cl. .......................... 438/305; 438/586; 438/655
(58) Field of Search ............................ 438/305, 306, 438/307, 513, 586, 655, 656, 682, 683

(56) References Cited

U.S. PATENT DOCUMENTS

| | | | | |
|---|---|---|---|---|
| 4,835,112 | * | 5/1989 | Pfiester et al. | 438/305 |
| 5,208,472 | * | 5/1993 | Su et al. | 257/344 |
| 5,322,809 | * | 6/1994 | Moslehi | 438/305 |
| 5,536,684 | * | 7/1996 | Dass et al. | 438/533 |
| 5,691,212 | * | 11/1997 | Tsai et al. | 438/586 |
| 5,705,417 | * | 1/1998 | Tseng | 438/305 |

* cited by examiner

Primary Examiner—Chandra Chaudhari

(57) ABSTRACT

Sub-micron dimensioned, ultra-shallow junction MOS and/or CMOS transistor devices having reduced or minimal junction leakage are formed by a salicide process wherein carbonaceous residue on silicon substrate surfaces resulting from reactive plasma etching for sidewall spacer formation is removed prior to salicide processing. Embodiments include removing carbonaceous residues by performing a hydrogen ion plasma treatment.

20 Claims, 2 Drawing Sheets

US 6,171,919 B1

MOS TRANSISTOR FORMATION PROCESS INCLUDING POST-SPACER ETCH SURFACE TREATMENT FOR IMPROVED SILICIDE FORMATION

CROSS-REFERENCE TO RELATED APPLICATION

This application contains subject matter similar to subject matter disclosed in co-pending U.S. patent application Ser. No. 09/386,466, filed on Aug. 31, 1999.

FIELD OF THE INVENTION

The present invention relates to a method of manufacturing high-density integrated circuit semiconductor devices exhibiting reliable, adherent, low resistance, well-aligned contacts to source, drain, and gate electrode regions of active devices, such as MOS transistors formed in or on a semiconductor substrate, by utilizing self-aligned, refractory metal suicide ("salicide") processing methodology. The present invention has particular utility in manufacturing high-density integration semiconductor devices, including multi-level devices, with design rules of 0.18 μm and below, e.g., 0.15 μm and below.

BACKGROUND OF THE INVENTION

The escalating requirements for high density and performance associated with ultra-large scale integration (ULSI) devices necessitate design rules of 0.18 μm and below, such as 0.15 μm and below, with increased transistor and circuit speeds, high reliability, and increased manufacturing throughput. The reduction of design features, e.g., of source, drain, and gate regions of transistors formed in or on a common semiconductor substrate, challenges the limitations of conventional contact and interconnection technology, including conventional photolithographic, etching, and deposition techniques.

As a result of the ever-increasing demand for large-scale and ultra-small dimensioned integrated semiconductor devices, self-aligned techniques have become the preferred technology for forming such devices in view of their simplicity and capability of high-density integration. As device dimensions decrease in the deep sub-micron range, both vertically and laterally, many problems arise, especially those caused by an increase in sheet resistance of the contact areas to the source and drain regions and junction leakage as junction layer thickness decreases. To overcome this problem, the use of self-aligned, highly electrically conductive refractory metal suicides, i.e., salicides, has become commonplace in the manufacture of integrated circuit semiconductor devices comprising, e.g., MOS type transistors. Another technique employed in conjunction with refractory metal silicide technology is the use of lightly-doped source and drain extensions formed just at the edge of the gate region, while more heavily-doped source and drain regions, to which ohmic contact is to be provided, are laterally displaced away from the gate by provision of sidewall spacers on opposing sides of the gate electrode.

Salicide processing involves deposition of a metal that forms an intermetallic compound with silicon, but does not react with silicon oxides, nitrides, or oxynitrides under normal processing conditions. Refractory metals commonly employed in salicide processing include platinum (Pt), titanium (Ti), nickel (Ni), and cobalt (Co), each of which forms very low resistivity phases with silicon (Si), e.g., $PtSi_2$, $TiSi_2$, NiSi, and $CoSi_2$. In practice, the refractory metal is deposited in uniform thickness over all exposed upper surface features of a Si wafer, preferably by means of physical vapor deposition (PVD) from an ultra-pure sputtering target and an ultra-high vacuum, multi-chamber DC magnetron sputtering system. In MOS transistor formation, deposition is generally performed after gate etch and source/drain junction formation. In a less common variant, source/drain junction formation is effected subsequent to refractory metal layer deposition via dopant diffusion through the refractory metal layer into the underlying semiconductor. In either case, after deposition, the refractory metal layer blankets the top surface of the gate electrode, typically formed of heavily-doped polysilicon, the silicon oxide, nitride, or oxynitride sidewall spacers on the opposing side surfaces of the gate electrode, the silicon oxide isolation regions formed in the silicon substrate between adjacent active device regions, and the exposed surfaces of the substrate where the source and drain regions are formed or will be subsequently formed. As a result of thermal processing, e.g., a rapid thermal annealing process (RTA) performed in an inert atmosphere, the refractory metal reacts with underlying Si to form electrically conductive silicide layer portions on the top surface of the polysilicon gate electrode and on the exposed surfaces of the substrate where source and drain regions are or will be formed. Unreacted portions of the refractory metal layer, e.g., on the silicon oxide, nitride, or oxynitride sidewall spacers and the silicon oxide isolation regions, are then removed, as by a wet etching process selective to the metal silicide portions. In some instances, e.g., with Co, a first RTA step may be performed at a relatively lower temperature in order to form first-phase CoSi which is then subjected to a second RTA step performed at a relatively high temperature to convert the first-phase CoSi to second-phase, lower resistivity $CoSi_2$.

Illustrated in FIGS. 1(A)–1(E) are steps in a typical salicide process, illustratively $CoSi_2$, for manufacturing MOS transistors and CMOS devices according to one process scheme of the conventional art. The term "semiconductor substrate" as employed throughout the present disclosure and claims, denotes a Si-containing wafer, e.g., a monocrystalline Si wafer, or an epitaxial Si-containing layer formed on a semiconductor substrate and comprising at least one region 1 of a first conductivity type. It will be appreciated that for P-MOS transistors, region 1 is n-type and for N-MOS transistors, region 1 is p-type. It is further understood that the substrate may comprise pluralities of n- and p-type regions arrayed in a desired pattern, as, for example, in CMOS devices.

Referring more particularly to FIG. 1(A), reference numeral 1 indicates a region or portion of a Si-containing semiconductor substrate of a first conductivity type (p or n), fabricated as a MOS transistor precursor 2 for use in a salicide process scheme. Precursor 2 is processed, as by conventional techniques not described here in detail, in order to not unnecessarily obscure the primary significance of the following description. Precursor 2 comprises a plurality of, illustratively two, isolation regions 3 and 3' of a silicon oxide, e.g., shallow trench isolation (STI) regions, extending from the substrate surface 4 to a prescribed depth below the surface. A gate insulator layer 5, typically comprising a silicon oxide layer about 25–50 Å thick, is formed on substrate surface 4. Gate electrode 6, typically of heavily-doped polysilicon, is formed over a portion of silicon oxide gate insulator layer 5, and comprises opposing side surfaces 6', 6', and top surface 6". Blanket layer 7 of an insulative material, typically an oxide, nitride, or oxynitride of silicon, is then formed to cover all exposed portions of substrate surface 4 and the exposed surfaces of the various features formed thereon or therein, inter alia, the opposing side surfaces 6', 6' and top surface 6" of gate electrode 6 and the upper surface of STI regions 3, 3'. The thickness of blanket insulative layer 7 is selected so as to provide sidewall spacers 7', 7' of desired width (see below) on each of the opposing side surfaces 6', 6' of the gate electrode 6.

Referring now to FIG. 1(B), MOS precursor structure 2 is then subjected to an anisotropic etching process, as by reactive plasma etching utilizing a fluorocarbon- or fluorohydrocarbon-based plasma comprising argon (Ar) and at least one reactive gaseous species selected from $CF_4$ and $CHF_3$, for selectively removing the laterally extending portions of insulative layer 7 and underlying portions of the gate oxide layer 5, whereby sidewall spacers 7', 7' of desired width profile are formed along the opposing side surfaces 6', 6' of gate electrode 6.

Adverting to FIG. 1(C), moderately- to heavily-doped source and drain junction regions 8 and 9 of conductivity type opposite that of the substrate or epitaxial layer on a suitable substrate are then formed in substrate region 1, as by conventional ion implantation (the details of which are omitted for brevity), with sidewall spacers 7', 7' acting as implantation masks and setting the lateral displacement length of moderately- to heavily-doped source/drain regions 8 and 9 from the respective proximal edges 6', 6' of gate electrode 6.

With reference to FIG. 1(D), in a following step, the structure thus-formed with implanted moderately- to heavily-doped source/drain regions 8, 9 is subjected to a conventional high temperature treatment, typically rapid thermal annealing (RTA), for effecting activation and diffusion of the implanted dopant species, thereby also forming lightly doped, shallower depth source/drain extension regions 8', 9' laterally extending from the respective proximal edges of the moderately- to heavily-doped source/drain regions 8, 9 to just beneath the neighboring edge 6' of gate electrode 6. The above-described method for forming source/drain regions including lightly-doped extensions is merely illustrative: i.e., equivalent source/drain structures may be formed by alternative process schemes, e.g., by first lightly implanting substrate 1 with dopant impurities of second conductivity type, with the implanted regions extending to just beneath the respective edges of the gate electrode, followed by selective heavy implantation of the lightly-doped implant to form heavily-doped source/drain regions appropriately spaced from the gate electrode by the lightly-doped (extension) implants.

With continued reference to FIG. 1(D), a layer 10 of a refractory metal metal, typically Pt, Co, Ni, or Ti, is then formed, as by DC sputtering, to cover the exposed upper surfaces of precursor 2. Following refractory metal layer 10 deposition, a thermal treatment, typically rapid thermal annealing (RTA), is performed at a temperature and for a time sufficient to convert metal layer 10 to the corresponding electrically conductive metal silicide, e.g., $PtSi_2$, $CoSi_2$, NiSi, or $TiSi_2$. Since the refractory metal silicide forms only where metal layer 10 is in contact with the underlying silicon, the unreacted portions of metal layer 10 formed over the silicon oxide isolation regions 3 and 3' and silicon nitride sidewall spacers 7, 7' are selectively removed, as by a wet etch process.

Referring now to FIG. 1(E), the resulting structure after reaction and removal of unreacted metal comprises metal silicide layer portions 11 and 12, 12' respectively formed over gate electrode 6 and heavily-doped source and drain regions 8 and 9. Further processing may include, inter alia, formation of metal contact and dielectric insulator layers. However, as is evident from FIG. 1(E), the lower surfaces of the metal silicide layer 12, 12' portions formed by the above-described methodology are rough at the silicide-silicon interfaces, disadvantageously resulting in penetration of the underlying silicon substrate 1 by the silicide portions 12, 12'. Such penetration or "spiking" of the silicon in the region below the source and drain junction regions 8 and 9, illustratively shown at 13 and 13', can cause local shorting of the junctions, thereby resulting in junction leakage. The effect of junction penetration or spiking is greatest with metals such as Co, which have relatively high silicon consumption ratios. Junction penetration or spiking can be moderated or at least minimized and improved junction integrity provided by increasing the junction depth of source and drain regions 8 and 9 or by providing a thinner refractory metal layer, thereby reducing silicon consumption during silicidation. However, neither of these alternatives is satisfactory: the former approach runs counter to the trend toward smaller device dimensions, both vertically and laterally, in order to increase transistor switching speeds, and the latter approach results in an increase in metal silicide sheet resistance attendant its decrease in thickness.

A number of techniques for reducing leakage in ultra-shallow junctions employed in MOSFET type semiconductor devices have been proposed, such as are disclosed in U.S. Pat. Nos. 4,835,112; 5,208,472; 5,536,684; and 5,691,212. Such techniques, however, materially add to process complexity and include such steps as germanium implantation to retard dopant diffusion, provision of multiple dielectrics at the edges of the gate electrode, formation of a $CoSi_2$—$TiN_x$, bi-layer followed by removal of the $TiN_x$ layer and ion implantation of the remaining $CoSi_2$ layer, and formation of an amorphous silicon layer on a silicon MOS precursor and subsequent implantation, oxidation, annealing, etc., steps.

Thus, there exists a need for a simplified methodology for forming self-aligned silicide (i.e., salicide) contacts to ultra-thin transistor source and drain regions which provide low contact sheet resistance, absence of spiking, at least minimal junction leakage, and easy compatibility with conventional process flow for the manufacture of MOS-based semiconductor devices, e.g., CMOS devices. Moreover, there exists a need for an improved process for fabricating high quality, low junction leakage MOS transistor-based devices which provides increased manufacturing throughput and product yield.

DISCLOSURE OF THE INVENTION

An advantage of the present invention is a method of manufacturing a high density, sub-micron dimensioned integrated semiconductor device with an improved self-aligned contact structure.

Another advantage of the present invention is a method of forming MOS-based semiconductor devices and transistors with metal silicide-contacted shallow source and drain regions exhibiting very low junction leakage.

Still another advantage of the present invention is a method of removing undesired contaminants and residues from silicon semiconductor surfaces prior to refractory metal layer deposition thereon for silicidation reaction therewith.

Yet another advantage of the present invention is a MOS transistor having very low sheet resistance self-aligned metal silicide contacts and ultra-shallow source and drain junction regions with very low junction leakage.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are achieved in part by a method of manufacturing a semiconductor device, which method comprises the steps of:

(a) providing a semiconductor substrate of a first conductivity type and having a surface;

(b) forming a thin gate insulator layer in contact with the substrate surface;

(c) forming a gate electrode on a portion of the gate insulator layer, the gate electrode comprising first and second opposing side surfaces and a top surface;

(d) forming a blanket layer of an insulative material on the exposed portions of the thin gate insulator layer on the substrate surface and on the first and second opposing side surfaces and the top surface of the gate electrode;

(e) selectively removing, by anisotropically etching, (1) the blanket layer of insulative material and underlying portions of the thin gate insulator layer from the substrate surface, and (2) the blanket layer of insulative material from the top surface of the gate electrode, thereby forming a tapered insulative sidewall spacer on each of the first and second opposing side surfaces of the gate electrode, with portions of the thin gate insulator layer remaining below the wider bottom ends of the tapered sidewall spacers adjacent the substrate surface and exposed portions of the substrate surface being formed adjacent each of the sidewall spacers;

(f) selectively introducing dopant impurities of a second, opposite conductivity type into the exposed portions of the substrate surface adjacent each of the sidewall spacers to form a pair of spaced-apart, source/drain regions in the substrate, each of the pair of source/drain regions extending to just beneath a respective proximal edge of the gate electrode; and (g) removing residue and/or contaminants resulting from the anisotropically etching from the exposed portions of the substrate surface and from the top surface of the gate electrode.

In embodiments according to the present invention, step (g) is performed either prior or subsequent to performing step (f); step (a) comprises providing a silicon wafer substrate; step (b) comprises forming a silicon oxide thin gate insulating layer about 25–50 Å thick; step (c) comprises forming the gate electrode from an electrically conductive material comprising heavily-doped polysilicon; step (d) comprises forming a blanket layer of an insulative material comprising an oxide, nitride, or oxynitride of silicon of a preselected thickness for providing each of the tapered sidewall spacers with a preselected width at the wider bottom ends thereof adjacent the substrate surface; step (e) comprises anisotropically etching the blanket layer of insulating material in a reactive plasma comprising a fluorocarbon or fluorohydrocarbon compound selected from $CF_4$ and $CHF_3$; step (f) comprises selectively implanting the first conductivity type substrate with dopant-containing ions of second, opposite conductivity type; and step (g) comprises removing a carbonaceous residue from the exposed portions of the substrate surface and the top surface of the gate electrode by treatment with a $H_2$, $H_2/N_2$, or $NH_3$ plasma comprising ionized hydrogen.

According to a further embodiment of the present invention, the method further comprises the steps of:

(h) forming a blanket layer of a metal in contact with at least the exposed portions of the substrate surface adjacent the sidewall spacers, the top surface of the gate electrode, and the sidewall spacers;

(i) reacting the blanket metal layer to selectively form an electrically conductive silicide of the metal in contact with the exposed portions of the substrate surface adjacent the sidewall spacers and the top surface of the gate electrode; and (j) selectively removing unreacted portions of the blanket metal layer, including portions in contact with the sidewall spacers.

According to embodiments of the present invention, step (h) comprises forming the blanket metal layer from a refractory metal selected from the group consisting of platinum, titanium, cobalt, and nickel; and step (h) comprises thermally reacting the refractory metal layer with underlying silicon of the substrate.

According to another aspect of the present invention, a method of manufacturing an MOS semiconductor device comprises the steps of:

(a) providing a silicon semiconductor wafer substrate having a surface;

(b) forming a thin silicon oxide gate insulator layer about 25–50 Å thick in contact with the substrate surface;

(c) forming a gate electrode comprising heavily-doped polysilicon on a portion of the thin gate insulating layer, the gate electrode comprising first and second opposing side surfaces and a top surface;

(d) forming a blanket layer of an insulative material comprising an oxide, nitride, or oxynitride of silicon on the exposed portions of the thin gate insulator layer on the substrate surface and on the first and second opposing side surfaces and the top surface of the gate electrode;

(e) selectively removing, by anisotropically etching in a reactive plasma comprising a fluorocarbon or fluorohydrocarbon compound, (1) the blanket layer of insulative material and underlying portions of the thin gate insulator layer from the substrate surface, and (2) the blanket layer of insulative material from the top surface of the gate electrode, thereby forming a tapered insulative sidewall spacer on each of the first and second opposing side surfaces of the gate electrode, with portions of the thin gate insulator layer remaining below the wider bottom ends of the tapered sidewall spacers adjacent the substrate surface and exposed portions of the substrate surface being formed adjacent each of the sidewall spacers;

(f) selectively ion implanting dopant impurities of a second, opposite conductivity type into the exposed portions of the substrate surface adjacent each of the sidewall spacers to form a pair of spaced-apart, source/drain regions in the substrate, each of the pair of source/drain regions extending to just beneath a respective proximal edge of the gate electrode;

(g) removing carbonaceous residue and/or contaminants resulting from the anisotropic reactive plasma etching from the exposed portions of the substrate surface adjacent the sidewall spacers and from the top surface of the gate electrode by treatment with a plasma comprising ionized hydrogen;

(h) forming a blanket layer of a refractory metal selected from the group consisting of platinum, titanium, cobalt, and nickel in contact with the exposed portions of the substrate surface adjacent the sidewall spacers, the top surface of the gate electrode, and the sidewall spacers;

(i) reacting the blanket metal layer to selectively form an electrically conductive silicide of the metal at portions thereof in contact with the exposed portions of the silicon substrate surface adjacent the sidewall spacers and the top surface of the polysilicon gate electrode; and (i) selectively removing unreacted portions of the blanket metal layer, including portions in contact with the insulative sidewall spacers.

In embodiments according to the present invention, step (g) is performed prior or subsequent to performing step (f) and the ionized hydrogen plasma comprises a $H_2$, $H_2/N_2$, or $NH_3$ plasma.

According to yet another aspect of the present invention, silicon-based MOS-type transistor devices formed by the method of the above-enumerated steps (a)–(j) are provided.

Additional advantages and aspects of the present invention will become readily apparent to those skilled in the art from the following detailed description, wherein only the preferred embodiment of the present invention is shown and described, simply by way of illustration of the best mode contemplated for carrying out the method of the present invention. As will be described, the present invention is capable of other and different embodiments, and its several details are susceptible of modification in various obvious respects, all without departing from the spirit of the present invention. Accordingly, the drawing and description are to be regarded as illustrative in nature, and not as limitative.

BRIEF DESCRIPTION OF THE DRAWINGS

The following detailed description of the embodiment of the present invention can best be understood when read in conjunction with the following drawings, in which like reference numerals are employed throughout to designate similar features, wherein.

DESCRIPTION OF THE INVENTION

The present invention addresses and solves problems arising from manufacturing submicron-dimensioned, ultra-shallow junction MOS and CMOS transistors suitable for use in high-density integration semiconductor devices, wherein, as part of the fabrication methodology, insulative sidewall spacers are formed by selective anisotropic etching of a blanket insulator layer, which sidewall spacers act as at least part of an implantation mask during formation of moderately- to heavily-doped source/drain junction regions to which electrical contact is made by use of salicide technology. More specifically, the present invention advantageously provides a significant and substantial reduction in the amount and severity of spiking resulting from junction penetration during silicidation reaction performed as part of the salicide processing, which spiking deleteriously affects junction quality, typically manifested as increased junction leakage current. Moreover, the inventive methodology provides increased device reliability while decreasing product yield problems associated with the conventional technology. In addition, the inventive method is fully compatible with other aspects of existing processing methodology.

Figure 1A:
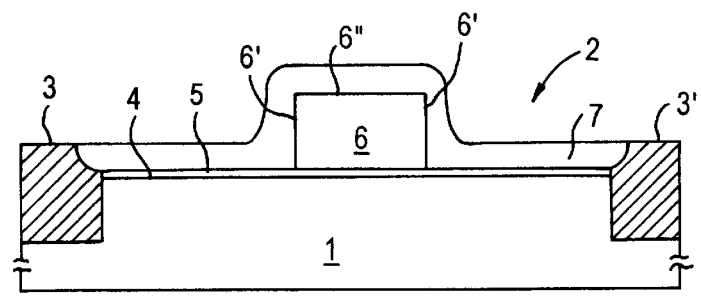
FIGS. 1(A)–1(E) illustrate, in simplified, cross-sectional schematic form, a sequence of steps for forming MOS type transistors utilizing salicide technology according to conventional practices.
Figure 1B:
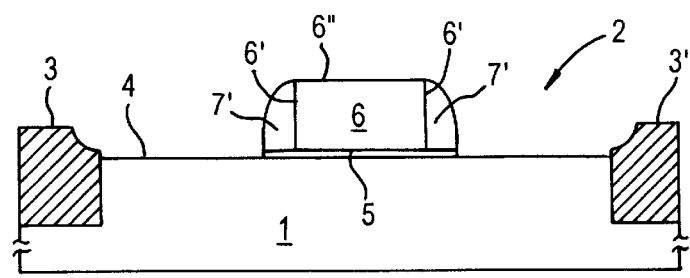
Figure 1E:
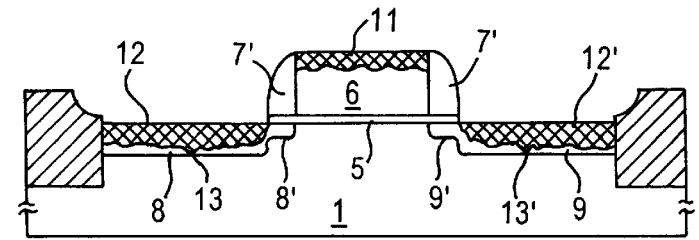
Figure 2:
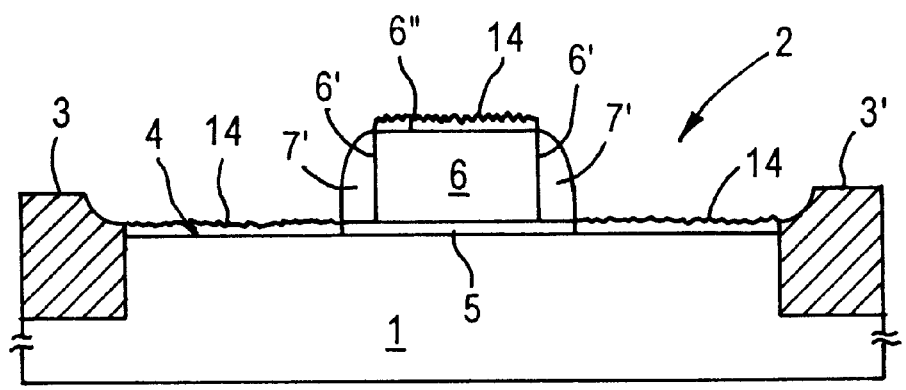
FIG. 2 illustrates, in simplified, cross-sectional schematic form, a plasma treatment step according to the inventive methodology for removing surface residues and/or contaminants prior to the silicidation processing of FIG. 1(D)

Referring now to FIG. 2, which figure is analogous to FIG. 1(B) according to the conventional art described supra and illustrates the state of a MOS device precursor after anisotropic selective etching of blanket insulator layer 7 typically comprised of an oxide, nitride, or oxynitride of silicon, for forming insulative sidewall spacers 7', 7'. As previously indicated, such anisotropic selective etching typically comprises reactive plasma etching utilizing a fluorocarbon- or fluorohydrocarbon-based plasma comprising at least one reactive, carbon-containing gaseous species selected from $CF_4$ and $CHF_3$. The present invention is based upon recognition that such selective anisotropic reactive plasma etching utilizing fluorocarbon- and/or fluorohydrocarbon-based materials disadvantageously results in formation of a carbonaceous residue or contaminant 14 on at the exposed portions of the substrate surface 4 adjacent sidewall spacers 7', 7' and the top surface 6" of gate electrode 6, which residue and/or contamination causes uneven silicidation reaction during subsequent processing, leading to junction penetration or spiking, as illustratively indicated above at 13 in FIG. 1(E).

Referring still to FIG. 2, according to the inventive methodology, subsequent to the selective anisotropic etching step of FIG. 1(B) for forming insulative sidewall spacers 7', 7', the MOS precursor structure is subjected to a plasma treatment for removal of the carbonaceous residue and/or contamination 14 from the exposed portions of the substrate surface 4 adjacent the sidewall spacers 7', 7' and from the top surface 6" of gate electrode 6. Such plasma treatment is preferably performed prior to implantation of the exposed substrate surface portions for source/drain formation; however, it is within the spirit of the present invention to perform the plasma treatment subsequent to source/drain ion implantation. By way of illustration, but not limitation, removal of carbonaceous residue 14 may be effected by treating the exposed substrate surface portions adjacent the sidewall spacers and the top surface of the gate electrode to a plasma comprising ionized hydrogen, e.g., as is obtained with gases or gas mixtures selected from $H_2$, $H_2/N_2$, and $NH_3$. Hydrogen ion-containing plasmas for use in the present invention may be generated in any conventional manner, e.g., as by DC, AC, or RF excitation. Given the present disclosure and the objectives of the present invention, suitable parameters for complete removal of residue 14 (as determined by conventional analytical methods not described herein for brevity) by such plasma treatment, e.g., gas pressure, power density, treatment duration, etc., may be optimized for use in particular situations. By way of illustration, but not limitation, plasma conditions suitable for use in the present invention include: DC or RF excitation at 100–1,000 W, $H_2$ gas pressures of 100–300 mTorr, and treatment times of 20–400 sec.

Figure 1C:
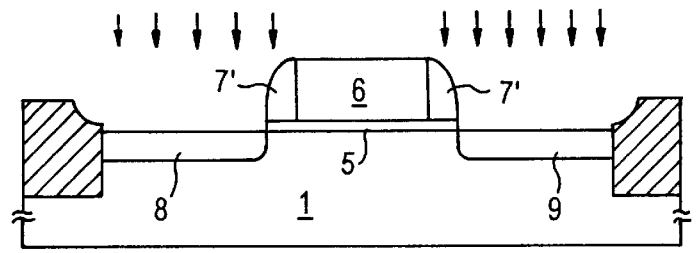
Figure 1D:
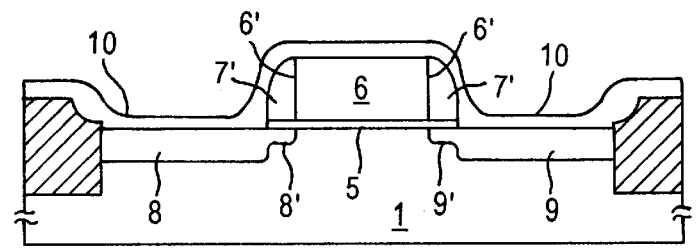
Figure 3:
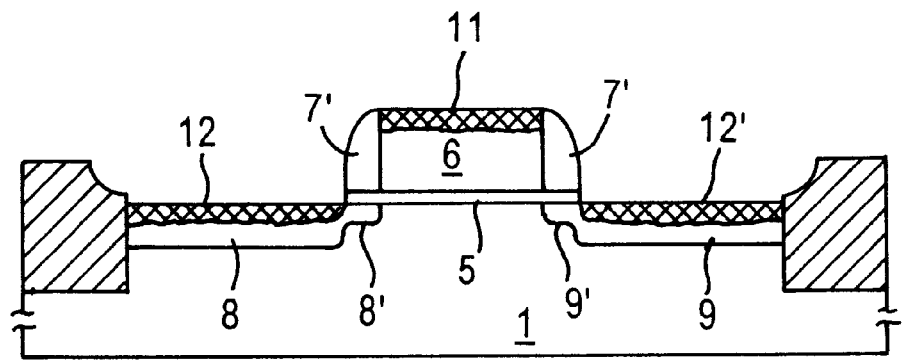
FIG. 3 illustrates, in simplified, cross-sectional schematic view, an MOS transistor comprising salicide source, gate, and drain contacts formed by the method of the present invention.

Upon completion of the plasma treatment for removal of carbonaceous residue 14, salicide reaction proceeds in conventional manner, e.g., as illustrated in FIGS. 1(C)–1(E), described supra, for forming MOS-type transistors including metal silicide-contacted moderately- to heavily-doped source and drain regions 8, 9, along with respective lightly-doped, shallow-depth, source and drain extensions 8', 9'. As may be evident from FIG. 3, MOS-type transistors formed according to the inventive methodology are substantially free of the junction penetration or spiking associated with the conventional methodology, e.g., as shown at 13 in FIG. 1(E). As a consequence, MOS-type devices fabricated according to the method of the present invention exhibit reduced junction leakage currents as compared with similar devices obtained via conventional methodology.

The present invention thus enables formation of reliable, defect-free, low junction leakage, submicron-dimensioned MOS transistors and CMOS devices at rates consistent with the requirements of manufacturing throughput, and is fully compatible with conventional process flow for automated manufacture of high-density integration semiconductor devices.

In the previous description, numerous specific details are set forth, such as specific materials. structures, reactants, processes, etc. in order to provide a better understanding of the present invention. However, the present invention can be practiced without resorting to the details specifically set forth. In other instances, well-known processing materials and techniques have not been described in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of manufacturing a semiconductor device, which method comprises the steps of:
   (a) providing a semiconductor substrate of a first conductivity type and having a surface;
   (b) forming a thin gate insulator layer in contact with said substrate surface;
   (c) forming a gate electrode on a portion of said gate insulator layer, said gate electrode comprising first and second opposing side surfaces and a top surface;
   (d) forming a blanket layer of an insulative material on the exposed portions of said thin gate insulator layer on said substrate surface and on said first and second opposing side surfaces and said top surface of said gate electrode;
   (e) selectively removing, by anisotropically etching, (1) said blanket layer of insulative material and underlying portions of said thin gate insulator layer from said substrate surface, and (2) said blanket layer of insulative material from said top surface of said gate electrode, thereby forming a tapered insulative sidewall spacer on each of said first and second opposing side surfaces of said gate electrode, with portions of said thin gate insulator layer remaining below the wider bottom ends of said tapered sidewall spacers adjacent said substrate surface and exposed portions of said substrate surface being formed adjacent each of said sidewall spacers;
   (f) selectively introducing dopant impurities of a second, opposite conductivity type into said exposed portions of said substrate surface adjacent each of said sidewall spacers to form a pair of spaced-apart, source/drain regions in said substrate, each of said pair of source/drain regions extending to just beneath a respective proximal edge of said gate electrode; and
   (g) removing residue and/or contaminants resulting from said anisotropically etching from said exposed portions of said substrate surface adjacent said sidewall spacers and from said top surface of said gate electrode.

2. The method as in claim 1, comprising performing step (g) after step (e) and prior to performing step (f).

3. The method as in claim 1, comprising performing step (g) after performing steps (e) and (f).

4. The method as in claim 1, wherein step (a) comprises providing a silicon wafer substrate.

5. The method as in claim 4, wherein step (b) comprises forming a silicon oxide thin gate insulating layer about 25–50 Å thick.

6. The method as in claim 5, wherein step (c) comprises forming said gate electrode from an electrically conductive material comprising heavily-doped polysilicon.

7. The method as in claim 6, wherein step (d) comprises forming a blanket layer of an insulative material comprising an oxide, nitride, or oxynitride of silicon of a preselected thickness for providing each of said tapered insulative spacers with a preselected width at said wider bottom ends thereof adjacent said substrate surface.

8. The method as in claim 7, wherein step (e) comprises anisotropically etching said blanket layer of insulative material in a reactive plasma comprising a fluorocarbon or fluorohydrocarbon compound.

9. The method as in claim 8, wherein said fluorocarbon or fluorohydrocarbon compound is selected from the group consisting of $CF_4$ and $CHF_3$.

10. The method as in claim 8, wherein step (g) comprises removing a carbonaceous residue and/or contaminant from said exposed portions of said substrate surface adjacent said sidewall spacers and from said top surface of said gate electrode.

11. The method as in claim 10, comprising removing said carbonaceous residue by treating said exposed portions of said substrate surface adjacent said sidewall spacers and said top surface of said gate electrode with a plasma.

12. The method as in claim 11, wherein said plasma comprises an ionized hydrogen plasma.

13. The method as in claim 12, wherein said plasma comprises a $H_2$, $H_2/N_2$, or $NH_3$ plasma.

14. The method as in claim 7, further comprising the steps of:
   (h) forming a blanket layer of a metal in contact with at least said exposed portions of said substrate surface adjacent said sidewall spacers, said top surface of said gate electrode, and said sidewall spacers;
   (i) reacting said blanket metal layer to selectively form an electrically conductive silicide of said metal at portions thereof in contact with said exposed portions of said substrate surface adjacent said sidewall spacers and said top surface of said gate electrode; and
   (j) selectively removing unreacted portions of said blanket metal layer, including portions in contact with said sidewall spacers.

15. The method as in claim 14, wherein step (h) comprises forming said blanket metal layer from a refractory metal selected from the group consisting of platinum, titanium, cobalt, and nickel; and step (i) comprises thermally reacting said refractory metal layer with underlying silicon of said substrate.

16. The method as in claim 4, wherein step (f) comprises selectively implanting said first conductivity type substrate with dopant-containing ions of second, opposite conductivity type.

17. A method of manufacturing an MOS semiconductor device, which method comprises the steps of:
   (a) providing a silicon semiconductor wafer substrate of first conductivity type and having a surface;

(b) forming a thin silicon oxide gate insulator layer about 25–50 Å thick in contact with said substrate surface;

(c) forming a gate electrode comprising heavily-doped polysilicon on a portion of said thin gate insulator layer, said gate electrode comprising first and second opposing side surfaces and a top surface;

(d) forming a blanket layer of an insulative material comprising an oxide, nitride, or an oxynitride of silicon on the exposed portions of said thin gate insulator layer on said substrate surface and on said first and second opposing side surfaces and said top surface of said gate electrode;

(e) selectively removing, by anisotropically etching in a reactive plasma comprising a fluorocarbon or fluorohydrocarbon compound, (1) said blanket layer of insulative material and underlying portions of said thin gate insulator layer from said substrate surface, and (2) said blanket layer of insulative material from said top surface of said gate electrode, thereby forming a tapered insulative sidewall spacer on each of said first and second opposing side surfaces of said gate electrode, with portions of said thin gate insulator layer remaining below the wider bottom ends of said tapered sidewall spacers adjacent said substrate surface and exposed portions of said substrate surface being formed adjacent each of said sidewall spacers;

(f) selectively ion implanting dopant impurities of a second, opposite conductivity type into said exposed portions of said substrate surface adjacent each of said sidewall spacers to form a pair of spaced-apart, source/drain regions in said substrate, each of said pair of source/drain regions extending to just beneath a respective proximal edge of said gate electrode;

(g) removing carbonaceous residue and/or contaminants resulting from said anisotropic reactive plasma etching from said exposed portions of said substrate surface adjacent said sidewall spacers and from said top surface of said gate electrode by treatment with a plasma comprising ionized hydrogen;

(h) forming a blanket layer of a refractory metal selected from the group consisting of platinum, titanium, cobalt, and nickel in contact with said exposed portions of said substrate surface adjacent said sidewall spacers, said top surface of said gate electrode, and said sidewall spacers;

(i) reacting said blanket metal layer to selectively form an electrically conductive silicide of said metal at portions thereof in contact with said exposed portions of said silicon substrate surface adjacent said sidewall spacers and said top surface of said polysilicon gate electrode; and (j) selectively removing unreacted portions of said blanket metal layer, including portions in contact with said sidewall spacers.

18. The method as in claim 17, comprising performing step (g) prior or subsequent to performing step (f).

19. The method as in claim 17, wherein said ionized hydrogen plasma comprises a $H_2$, $H_2/N_2$, or $NH_3$ plasma.

20. A silicon-based MOS transistor device formed according to the method of claim 17.

* * * * *